US010294564B2

(12) United States Patent
Mane et al.

(10) Patent No.: US 10,294,564 B2
(45) Date of Patent: May 21, 2019

(54) METHOD OF CREATING BORON COMPRISING LAYER

(71) Applicant: UCHICAGO ARGONNE, LLC, Chicago, IL (US)

(72) Inventors: Anil U. Mane, Naperville, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 15/688,653

(22) Filed: Aug. 28, 2017

(65) Prior Publication Data

US 2019/0062915 A1 Feb. 28, 2019

(51) Int. Cl.

*C23C 16/40* (2006.01)
*C23C 16/455* (2006.01)
*C23C 16/38* (2006.01)
*C23C 16/44* (2006.01)

(52) U.S. Cl.

CPC ........ *C23C 16/45553* (2013.01); *C23C 16/38* (2013.01); *C23C 16/403* (2013.01); *C23C 16/4408* (2013.01)

(58) Field of Classification Search

CPC ........ C23C 16/40; C23C 16/403; C23C 16/38
See application file for complete search history.

(56) References Cited

U.S. PATENT DOCUMENTS 2,422,884 A * 6/1947 Burgin ..................... B01J 21/02 585/664
4,392,002 A * 7/1983 Cosyns ..................... C07C 2/10 585/329
4,544,791 A * 10/1985 Juguin ..................... C07C 2/10 585/517
6,110,854 A * 8/2000 Aldinger ............... C04B 35/113 501/127
6,174,432 B1 * 1/2001 Mizutani .................. B01J 21/02 208/108
6,749,828 B1 * 6/2004 Fukunaga ............. B01J 21/066 252/373
6,835,349 B2 * 12/2004 Pyzik .................... C04B 41/009 419/12
2001/0041250 A1 * 11/2001 Werkhoven ........... C23C 16/029 428/212
2002/0037937 A1 * 3/2002 Raje ........................ B01J 21/02 518/715
2003/0207032 A1 * 11/2003 Ahn .................... C23C 16/4412 427/255.34
2014/0001090 A1 * 1/2014 Yang ...................... C10G 65/02 208/89

FOREIGN PATENT DOCUMENTS

EP 0960652 A1 * 12/1997 .............. B01J 21/02

OTHER PUBLICATIONS

Karpova, T.R., et al., "Synthesis, Structure and Properties of the System B2O3/Al2O3". Chemistry for Sustainable Development 21 (2013) 53-60.*
Shonhiwa, A., et al., "Reaction bonded aluminum oxide composites containing cubic boron nitride". Ceramics International 35 (2009) 909-911.*
Blackburn, Paul E., et al., "Thermodynamics of Vaporization in the Aluminum Oxide-Boron Oxide System". Thermodnamics of Vaporization in the Al2O3—B2O3 System, vol. 70, No. 8, Aug. 1966, pp. 2469-2474.*
Dubois, Jean-Luc, et al., "Preparation of boron-containing alumina supports by kneading". Preparation of Catalysts VI, 1995, pp. 833-842.*
Mane, et al., "Atomic layer deposition of boron-containing films using B2F4," Journal of Vacuum Science & Technology A 34, 01A132, 5 pages (2016).

* cited by examiner

*Primary Examiner* — Bret P Chen
(74) *Attorney, Agent, or Firm* — Foley & Lardner LLP

(57) ABSTRACT

A method for forming boron (B) containing $Al_2O_3$ composite layers includes (a) reacting a substrate surface with an aluminum-containing precursor to form a first monolayer, (b) purging excess aluminum-containing precursor and reaction by-product, (c) reacting the first monolayer with a second precursor, and (d) purging excess second precursor and reaction by-product, such that steps (a) to (d) constitute one cycle, the composite layers being formed after a plurality of cycles, and the resultant composite layers have a chemical formula of $B_xAl_{2-x}O_3$, where x varies in the range of 0 and 2.

20 Claims, 4 Drawing Sheets

METHOD OF CREATING BORON COMPRISING LAYER

STATEMENT OF GOVERNMENT INTEREST

The United States Government claims certain rights in this invention pursuant to Contract No. DE-AC02-06CH11357 between the U.S. Department of Energy and U. Chicago Argonne, LLC, as operator of Argonne National Laboratory.

FIELD OF THE INVENTION

The present invention generally relates to methods of creating boron-containing layers. Specifically, the present invention relates to fabrication of $B_xAl_{2-x}O_3$ layers using atomic layer deposition (ALD).

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Boron-comprising layers are useful in many applications such as dopants in semiconductor devices, shielding, neutron detection and absorber in nuclear reactors, neutron capture therapy in cancer treatments, stabilizing transparent conductors (TCO) for display devices, boronated fiber glass, boron-containing neodymium magnets (i.e. $Nd_2Fe_{14}B$) and superconducting material (i.e. $MgB_2$), and components in 2D boron nitride and hard boron carbide ceramics. Specific to semiconductors, miniaturizations of microelectronic and MEMS devices have created the need for conformal, uniform coatings of boron-containing layers grown on 3D structures. For example, silicon-based photomultipliers (SiPMTs) and micro-channel plate (MCP) detectors integrated with boron-comprising layers may be used in neutron sensor devices when the boron-comprising layer is enriched with $^{10}B$ isotopes.

Conventionally, boron-containing layers such as $B_2O_3$ and pure boron have suffered from (1) instabilities due to high hydroscopic character (i.e. retention of water molecules from the surrounding environment), as in the case of $B_2O_3$, or (2) high capital and energy resources (i.e. high temperature, infrared (IR) heating or plasma sources) required to deposit and maintain the boron-containing layers.

A need exists for improved technology, including a method of fabricating boron-containing layers using atomic layer deposition.

SUMMARY

In one embodiment, a method for forming boron (B) containing $Al_2O_3$ composite layers comprises (a) reacting a substrate surface with an aluminum-containing precursor to form a first monolayer, (b) purging excess aluminum-containing precursor and reaction by-product, (c) reacting the first monolayer with a second precursor, and (d) purging excess second precursor and reaction by-product, such that steps (a) to (d) constitute one cycle, the composite layers being formed after a plurality of cycles, and the resultant composite layers have a chemical formula of $B_xAl_{2-x}O_3$, where x varies in the range of 0 and 2.

In one embodiment, step (c) comprises (c1) reacting the first monolayer with a boron-containing precursor to form a boron-containing surface, and (c2) purging excess boron-containing precursor and reaction by-product. In one embodiment, step (c) further comprises (c3) reacting the boron-containing surface with an oxygen-containing precursor, and (c4) purging excess oxygen-containing precursor and reaction by-product. In one embodiment, the boron-containing precursor comprises a boron-containing component and an alcohol compound component. In one embodiment, the boron-containing component is boric acid ($BH_3O_3$) and the alcohol compound component is a $C_1$—$C_6$ alcohol compound. In one embodiment, the boron-containing precursor is trimethyl borate (TMB) ($C_3H_9BO_3$). In one embodiment, the boron-containing precursor is boric acid ($BH_3O_3$) and the oxygen-containing precursor is water ($H_2O$).

In one embodiment, the second precursor comprises a boron-containing component and optionally an alcohol compound component. In one embodiment, the second precursor comprises a boron-containing component and optionally an oxygen-containing component. In one embodiment, the boron-containing component comprises at least one of boric acid ($BH_3O_3$), trimethyl borate (TMB) ($C_3H_9BO_3$), boron tribromide ($BBr_3$), boron trifluoride ($BF_3$), diboron tetrafluoride ($B_2F_4$), triisopropylborane ($(C_3H_7)_3B$), triethoxyborane ($(C_2H_5O)_3B$), or triisopropoxyborane ($(C_3H_7O)_3B$). In one embodiment, the alcohol compound component comprises a $C_1$-$C_6$ alcohol compound. In one embodiment, the oxygen-containing component comprises at least one of water ($H_2O$), ozone ($O_3$), hydrogen peroxide ($H_2O_2$), or oxygen ($O_2$). In one embodiment, the boron-containing precursor is enriched with $^{11}B$ or $^{10}B$ isotopic elements.

In one embodiment, the aluminum-containing precursor comprises at least one of trimethylaluminum ($Al(CH_3)_3$) (TMA), triethylaluminum ($(C_2H_5)_3Al$) (TEA), triethyl (tri-sec-butoxy)dialuminum ($(C_2H_5)_3Al_2(OC_4H_9)_3$), aluminum chloride ($AlCl_3$), aluminum isopropoxide ($Al((OCH(CH_3)_2)_3$), dimethylaluminum isopropoxide ($(CH_3)_2AlOCH(CH_3)_2$), tris(2,2,6,6-tetramethyl-3,5-heptanedionato)aluminum ($Al(TMHD)_3$), tri-isobutylaluminum ($(C_4H_9)_3Al$), aluminum hexafluoroacetylacetonate ($Al(CF_3COCHCOCF_3)_3$), aluminum ethoxide ($Al(OC_2H_5)_3$), aluminum s-butoxide ($Al(OC_4H_9)_3$), or aluminum acetylacetonate ($Al(CH_3COCHCOCH_3)_3$). In one embodiment, step (c) comprises (c1) reacting the first monolayer with an oxygen-containing precursor to form an oxygen-containing surface, and (c2) purging excess oxygen-containing precursor and reaction by-product.

In one embodiment, step (c) further comprises (c3) reacting the oxygen-containing surface with a boron-containing precursor, such that step (c3) is conducted prior to step (c2). In one embodiment, step (c) further comprises (c3) reacting the oxygen-containing surface with a boron-containing precursor, and (c4) purging excess boron-containing precursor and reaction by-product. In one embodiment, the boron-containing precursor comprises a boron-containing component and an alcohol compound component. In one embodiment, the oxygen-containing precursor is water ($H_2O$) and the boron-containing precursor is trimethyl borate (TMB) ($C_3H_9BO_3$). In one embodiment, the boron-containing component is boric acid ($BH_3O_3$) and the alcohol compound component is a $C_1$-$C_6$ alcohol compound.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which:

FIG. 1A shows the growth of $B_xAl_{2-x}O_3$ for sample no. 4, where no water precursor was used. FIG. 1B shows the growth of $B_xAl_{2-x}O_3$ for sample no. 2, where water precursor was used and introduced after BA/MeOH. ALD cycles for both samples 2 and 4 are shown in Table 1.

FIG. 2A shows the growth of $B_xAl_{2-x}O_3$ for sample no. 5, where a nitrogen purge was utilized in between the water and boron precursors. FIG. 2B shows the growth of $B_xAl_{2-x}O_3$ for sample no. 6, where no nitrogen purge was utilized in between the water and boron precursors. ALD cycles for both samples 5 and 6 are shown in Table 1.

DETAILED DESCRIPTION

Figure 1A:
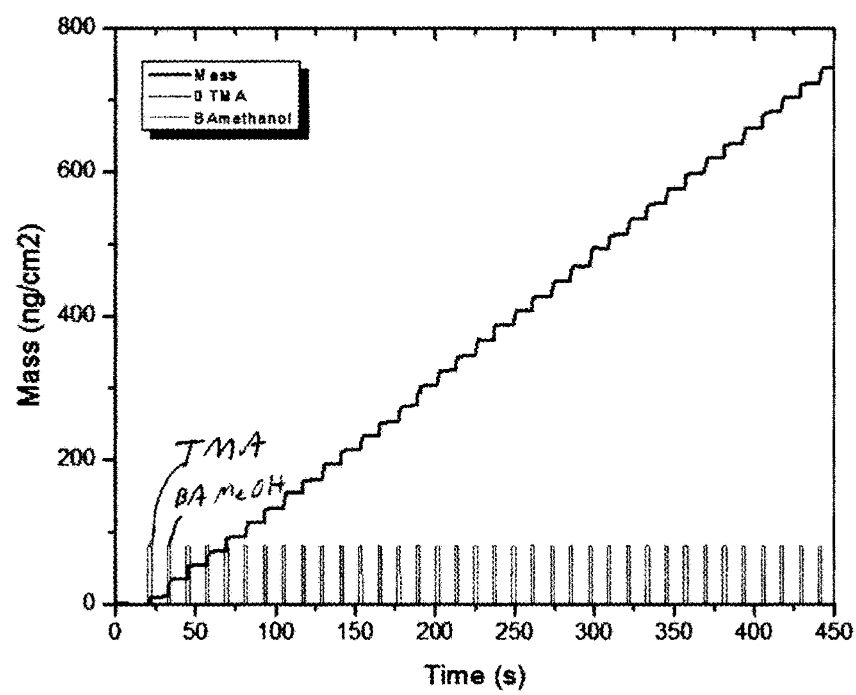
FIGS. 1A and 1B illustrate the increase in mass of the deposited $B_xAl_{2-x}O_3$ film as a function of time for multiple ALD cycles using quartz crystal microbalances.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure describes a new method for forming high quality, boron (B) containing $Al_2O_3$ composite layers deposited by atomic layer deposition (ALD) methods. Using the methods described herein, B—$Al_2O_3$ composites may be formed using ALD processes that are precisely controlled for deposition of thin and ultrathin B-comprising layers under low temperature environments such that resultant films are (1) free of fluorine (F) contaminants, (2) of uniform thickness and conformal with desire control concentration of boron over large areas and complex 3D structures, and (3) tunable for $^{10}B$ or $^{11}B$ isotope containing processes.

Described generally, ALD processes often comprise two half-reactions, whereby precursor materials for each half-reaction are kept separated throughout the coating process. ALD film growth is based on self-limiting surface reactions, which makes achieving atomic scale deposition control possible. In a first half-reaction, a precursor gas is introduced to a substrate surface and produces a first monolayer. Excess or unreacted species and/or reaction by-product from the first half-reaction may be purged from the substrate surface by flow of inert gas (i.e. nitrogen, argon, etc.), vacuum evacuation, or other similar removal techniques. A second precursor of gas is then introduced to the substrate surface and reacts with the first monolayer to produce a monolayer of film on the substrate surface. Excess or unreacted species and/or reaction by-product from the second half-reaction may be purged from the deposition chamber using similar evacuation methods as used for the excess or unreacted species and/or reaction by-product from the first half-reaction.

In a first step of the ALD process, a surface reacts with a first, aluminum-containing precursor to form a first monolayer. In one embodiment, the aluminum-containing precursor may be trimethylaluminum ($Al(CH_3)_3$) (TMA). In other embodiments, the aluminum-containing precursor may comprise at least one of triethylaluminum ($(C_2H_5)_3Al$) (TEA), triethyl(tri-sec-butoxy)dialuminum ($(C_2H_5)_3Al_2(OC_4H_9)_3$), aluminum chloride ($AlCl_3$), aluminum isopropoxide ($Al((OCH(CH_3)_2)_3$), dimethylaluminum isopropoxide ($(CH_3)_2AlOCH(CH_3)_2$), tris(2,2,6,6-tetramethyl-3,5-heptanedionato)aluminum ($Al(TMHD)_3$), triisobutylaluminum ($(C_4H_9)_3Al$), aluminum hexafluoroacetylacetonate ($Al(CF_3COCHCOCF_3)_3$), aluminum ethoxide ($Al(OC_2H_5)_3$), aluminum s-butoxide ($Al(OC_4H_9)_3$), or aluminum acetylacetonate ($Al(CH_3COCHCOCH_3)_3$). After formation of the first monolayer, excess aluminum-containing precursor and reaction by-product is purged from the system.

In one embodiment of a second step of the ALD process, the first monolayer reacts with a second, oxygen-containing precursor. In one embodiment, the oxygen-containing precursor may be water ($H_2O$). In other embodiments, the oxygen-containing precursor may comprise at least one of ozone ($O_3$), hydrogen peroxide ($H_2O_2$), or oxygen ($O_2$). Further, the oxygen containing precursor may consist of a first oxygen containing precursor and then exposure, optionally after a purge, of a second oxygen containing precursor.

In one embodiment of a second step of the ALD process, the first monolayer reacts with a second, boron-containing precursor. In one embodiment, the boron-containing precursor may be boric acid ($BH_3O_3$) or trimethyl borate (TMB) ($C_3H_9BO_3$). In other embodiments, the boron-containing precursor may comprise at least one of boron tribromide ($BBr_3$), boron trifluoride ($BF_3$), diboron tetrafluoride ($B_2F_4$), triisopropylborane ($(C_3H_7)_3B$), triethoxyborane ($(C_2H_5O)_3B$), or triisopropoxyborane ($(C_3H_7O)_3B$). The boron precursors disclosed herein may be enriched with $^{11}B$ or $^{10}B$ isotopic elements.

In one embodiment, the boron-containing precursor may be introduced into the reaction chamber simultaneously with a $C_1$-$C_6$ alcohol compound (i.e. methyl alcohol, ethyl alcohol, propyl alcohol, etc.). In one embodiment, the boron-containing precursor may be introduced into the reaction chamber prior to the alcohol compound and after purging of the excess aluminum-containing precursor and reaction by-product of the first half-reaction. In one embodiment, the boron-containing precursor may be introduced into the reaction chamber after the alcohol compound. In some embodiments where the $C_1$-$C_6$ alcohol compound is present, carbon comprises a minor impurity in the system, with the major component being boron in an $Al_2O_3$ matrix (i.e. $B_xAl_{2-x}O_3$).

After the second half-reaction, excess oxygen-containing precursor and/or excess boron-containing precursor and reaction by-product is purged from the system.

In one embodiment, the second step of the ALD process may include a first sub-step of reacting the first monolayer with the boron-containing precursor followed by purging excess boron-containing precursor and reaction by-product from the system and a second sub-step of reacting the boron-containing surface with the oxygen-containing precursor followed by purging excess oxygen-containing precursor and reaction by-product from the system. In one embodiment, the second step of the ALD process may include a first sub-step of reacting the first monolayer with the oxygen-containing precursor followed by purging excess oxygen-containing precursor and reaction by-product from the system and a second sub-step of reacting the oxygen-containing surface with the boron-containing precursor followed by purging excess boron-containing precursor and reaction by-product from the system.

In one embodiment, the second step of the ALD process may include a first sub-step of reacting the first monolayer with the oxygen-containing precursor followed by a second sub-step of reacting the oxygen-containing surface with the boron-containing precursor, followed by a third sub-step of purging excess oxygen-containing precursor, excess boron-containing precursor, and reaction by-product from the system. In one embodiment, the second step of the ALD process may include a first sub-step of reacting the first monolayer with the boron-containing precursor, followed by a second sub-step of reacting the boron-containing surface with the oxygen-containing precursor, followed by a third sub-step of purging excess boron-containing precursor, excess oxygen-containing precursor, and reaction by-product from the system.

Figure 4:
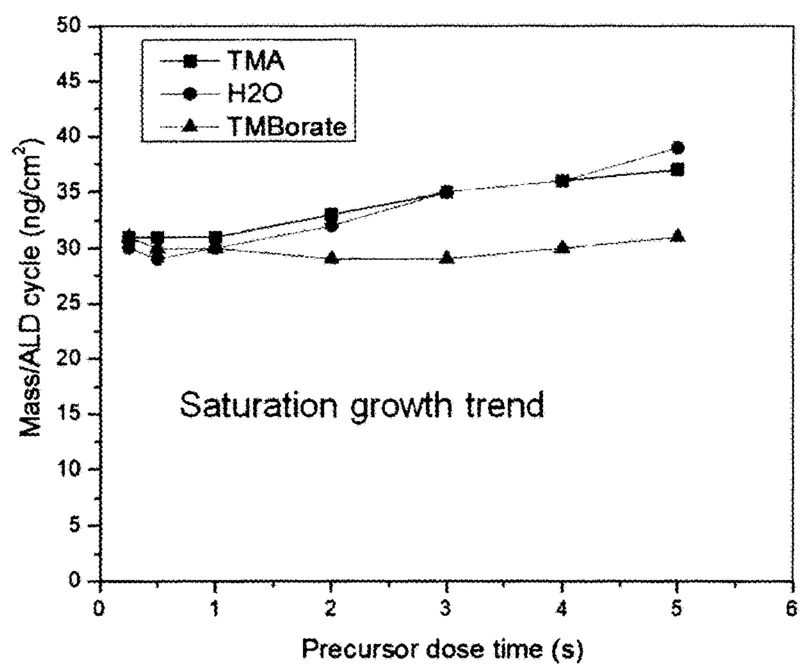
FIG. 4 illustrates the increase in mass of the deposited $B_xAl_{2-x}O_3$ film per ALD cycle as a function of dosage times for TMA, water, and TMB precursors using quartz crystal microbalances. The depicted ALD cycle is for sample no. 5.

In one embodiment, the first step of the ALD process and the second step of the ALD process are conducted to constitute a cycle of the boron-containing layer fabrication process. In one embodiment, the first step may occur prior to the second step. In another embodiment, the first step may occur after the second step. In yet another embodiment, the first step may occur before and after the second step. In one embodiment, at least two cycles are performed to form the B-containing $Al_2O_3$ composite layers of a predetermined thickness. In one embodiment, the oxygen-containing precursor is independently selected in each cycle. In one embodiment, the boron-containing precursor is independently selected in each cycle. In one embodiment, an even number of cycles are performed. In one embodiment, an odd number of cycles are performed. In one embodiment, ALD growth was performed at a temperature in the range of 50° C. to 300° C. In one embodiment, ALD growth was performed at a temperature in the range of 100° C. to 300° C. These low temperature ALD deposition processes of B—$Al_2O_3$ are attractive for flexible polymer substrates. Other factors affecting ALD film growth include reactor base pressure, precursor vapor pressure, and precursor exposure time. Reactor base pressure is the pressure of the reactor in vacuum without flow of the precursor vapor into the reaction chamber (i.e. a standing pressure). Precursor vapor pressure is based on the flow component. FIG. 4 provides exemplary data of precursor exposure time (i.e. dose time) for each precursor at 0.5 torr precursor vapor pressure.

The ALD processes disclosed herein offer several advantages such as digital control thickness and composition of the B-containing $Al_2O_3$ composite layers, conformal growth and high aspect ratio features, and batch production. In one embodiment, the low-temperature ALD process produced a resultant film having a chemical formula of $B_xAl_{2-x}O_3$, where x varies in the range of 0 and 2. In one example, the $B_xAl_{2-x}O_3$ is formed using a low-cost boric acid boron-containing precursor (B-containing boric acid). In one example, the $B_xAl_{2-x}O_3$ is formed using a water oxygen-containing precursor. In one example, the $B_xAl_{2-x}O_3$ is formed using a boric acid boron-containing precursor in conjunction with a methanol alcohol source. In one example, the boric acid boron-containing precursor and the methanol alcohol source are physically mixed prior to introducing into the ALD reaction chamber. In one example, the $B_xAl_{2-x}O_3$ is formed using a TMA aluminum-containing precursor. In one example, the excess or unreacted species and/or reaction by-product is purged from the reaction chamber by flow of inert gas (i.e. nitrogen, argon, etc.).

In one embodiment, the low-temperature ALD process produced a resultant film having a chemical formula of $^{10}B_xAl_{2-x}O_3$, wherein the boron element is $^{10}B$ available from any of the boron-containing precursor disclosed herein and where x varies in the range of 0 and 2. In one example, the $^{10}B_xAl_{2-x}O_3$ is formed using a low-cost boric acid boron-containing precursor ($^{10}B$-containing boric acid). In one example, the $^{10}B_xAl_{2-x}O_3$ is formed using a TMB boron-containing precursor ($^{10}B$-containing TMB). In one example, the $^{10}B_xAl_{2-x}O_3$ is formed using a water oxygen-containing precursor. In one example, the $^{10}B_xAl_{2-x}O_3$ is formed using a TMA aluminum-containing precursor. In one example, the excess or unreacted species and/or reaction by-product is purged from the reaction chamber by flow of inert gas (i.e. nitrogen, argon, etc.).

In one embodiment, the low-temperature ALD process produced a resultant film having a chemical formula of $^{11}B_xAl_{2-x}O_3$, wherein the boron element is $^{11}B$ available from any of the boron-containing precursor disclosed herein and where x varies in the range of 0 and 2. In one example, the $^{11}B_xAl_{2-x}O_3$ is formed using a low-cost boric acid boron-containing precursor ($^{11}B$-containing boric acid). In one example, the $^{11}B_xAl_{2-x}O_3$ is formed using a TMB boron-containing precursor ($^{11}B$-containing TMB). In one example, the $^{11}B_xAl_{2-x}O_3$ is formed using a water oxygen-containing precursor. In one example, the $^{11}B_xAl_{2-x}O_3$ is formed using a TMA aluminum-containing precursor. In one example, the excess or unreacted species and/or reaction by-product is purged from the reaction chamber by flow of inert gas (i.e. nitrogen, argon, etc.).

In one embodiment, the $B_xAl_{2-x}O_3$ layer may comprise an oxygen concentration in the range of 40 atomic % to 70 atomic %. In one embodiment, the $B_xAl_{2-x}O_3$ layer may comprise an oxygen concentration in the range of 50 atomic % to 60 atomic %. In one embodiment, the $B_xAl_{2-x}O_3$ layer may comprise an aluminum concentration in the range of 15 atomic % to 50 atomic %. In one embodiment, the $B_xAl_{2-x}O_3$ layer may comprise an aluminum concentration in the range of 25 atomic % to 40 atomic %. Precision-controlled atomic percentage of boron may also be achieved in the composite films. In one embodiment, the $B_xAl_{2-x}O_3$ layer may comprise a boron concentration in the range of 1 atomic % to 20 atomic %. In one embodiment, the $B_xAl_{2-x}O_3$ layer may comprise a boron concentration in the range of 5 atomic % to 15 atomic %. In the example where x equals 1 (i.e. $BAlO_3$), the boron concentration is 20 atomic %. In one embodiment, the boron concentration may be approximately 40 atomic %.

Table 1 below summarizes exemplary ALD cycles performed using the conditions disclosed herein.

TABLE 1

Exemplary boron-comprising layers using boric acid and TMB precursors, *elemental concentrations are units of atomic percentages

| Sample No. | ALD Cycle | Thickness (nm) | [O]* | [Al]* | [C]* | [B]* | Comments |
|---|---|---|---|---|---|---|---|
| Boron-comprising $B_xAl_{2-x}O_3$ using a boric acid (BA) precursor | | | | | | | |
| 1 | TMA, $N_2$, BA, $N_2$, $H_2O$, $N_2$ | 20 | 59 | 39 | <1 | NA | BA only |
| 2 | TMA, $N_2$, BA/MeOH, $N_2$, $H_2O$, $N_2$ | 24 | 56.35 | 29.09 | 4.49 | 10.07 | $H_2O$ after BA/MeOH |
| 3 | TMA, $N_2$, $H_2O$, $N_2$, BA/MeOH, $N_2$ | 21 | 57.81 | 31.64 | 2.62 | 7.92 | $H_2O$ before BA/MeOH |
| 4 | TMA, $N_2$, BA/MeOH, $N_2$ | 19 | 57 | 28.04 | 4.78 | 10.18 | No $H_2O$ |
| Boron-comprising $B_xAl_{2-x}O_3$ using a TMB precursor | | | | | | | |
| 5 | TMA, $N_2$, $H_2O$, $N_2$, TMB, $N_2$ | 20 | 58.33 | 30.75 | 2.3 | 8.62 | $H_2O$ after TMA; $N_2$ after $H_2O$ |
| 6 | TMA, $N_2$, $H_2O$, TMB, $N_2$ | 27 | 57.97 | 27.65 | 1.83 | 12.54 | No $N_2$ between $H_2O$ & TMB |
| 7 | TMA, $N_2$, TMB, $N_2$ | | | No growth | | | No $H_2O$ |

Figure 1B:
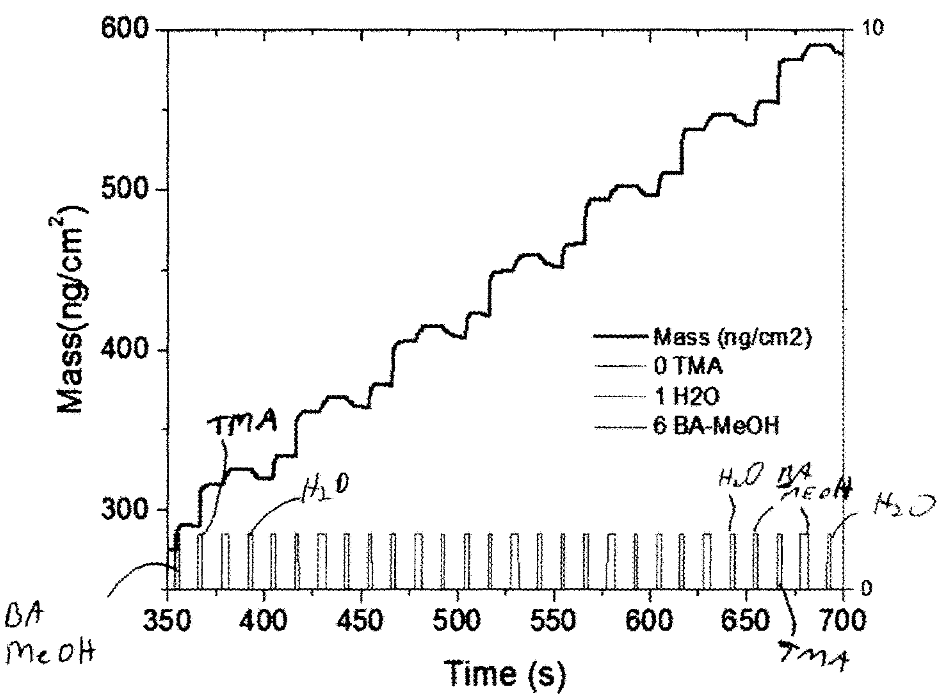

Characterization studies of the fabricated $B_xAl_{2-x}O_3$ were conducted using quartz crystal microbalance (QCM), which measures mass variation per unit area by measuring the change in frequency of a quartz crystal resonator. The resonance is disturbed by addition or removal of a small mass due to oxide growth/decay or film deposition at the surface of the acoustic resonator. FIGS. 1A and 1B illustrate the increase in mass of the deposited $B_xAl_{2-x}O_3$ film as a function of time for multiple ALD cycles. FIG. 1A depicts the growth of $B_xAl_{2-x}O_3$ for sample no. 4, where no water precursor was utilized. FIG. 1B depicts the growth of $B_xAl_{2-x}O_3$ for sample no. 2, where water precursor was used and $H_2O$ is introduced after BA/MeOH. Both sample nos. 2 and 4 use boric acid precursors. As the data shows, sample no. 4 (FIG. 1A) achieves a much more controlled linear growth than sample no. 2 (FIG. 1B) due to exclusion of water precursors from the ALD cycle. Thus, when boric acid precursors are used, growth cycles are more efficient when only two precursors are utilized (i.e. sample no. 4: TMA and BA/MeOH versus sample no. 2: TMA, BA/MeOH, and $H_2O$). For example, sample no. 4 reaches a mass density of about 750 $ng/cm^2$ in about 450 seconds while sample no. 2 reaches a mass density of about 600 $ng/cm^2$ in about 700 seconds.

Figure 2A:
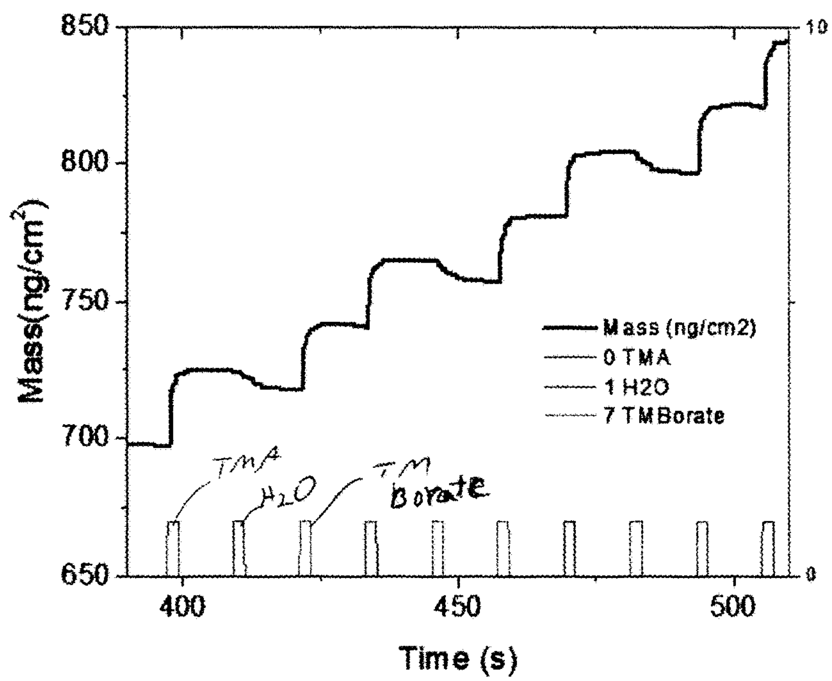
FIGS. 2A and 2B illustrate the increase in mass of the deposited $B_xAl_{2-x}O_3$ film as a function of time for multiple ALD cycles using quartz crystal microbalances.
Figure 2B:
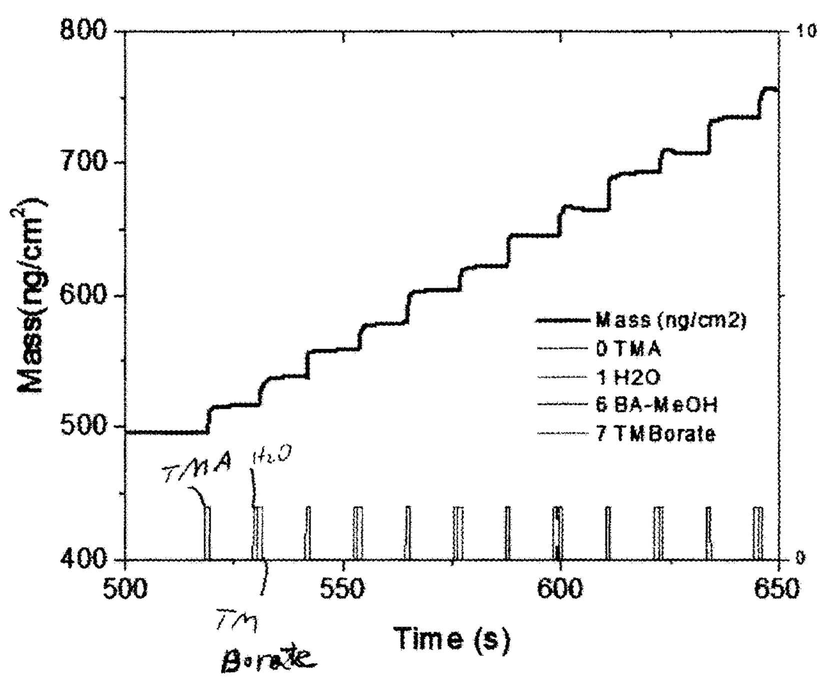

Additional QCM characterization studies were conducted for samples using TMB precursors. FIGS. 2A and 2B illustrate the increase in mass of the deposited $B_xAl_{2-x}O_3$ film as a function of time for multiple ALD cycles. FIG. 2A depicts the growth of $B_xAl_{2-x}O_3$ for sample no. 5, where a nitrogen purge was utilized in between the water and boron precursors (i.e. TMA, $N_2$, $H_2O$, $N_2$, TMB, $N_2$). FIG. 2B depicts the growth of $B_xAl_{2-x}O_3$ for sample no. 6, where no nitrogen purge was utilized in between the water and boron precursors (i.e. TMA, $N_2$, $H_2O$, TMB, $N_2$). Both sample nos. 5 and 6 use TMB precursors. As the data shows, sample no. 6 (FIG. 2B) achieves a much more controlled linear growth than sample no. 5 (FIG. 2A) due to the exclusion of a purge step evacuating the water precursor prior to introduction of TMB. Presence of excess oxygen-containing precursor (i.e. $H_2O$) and by-product from the reaction between water and the aluminum-coated substrate surface is available for reaction with incoming TMB, thus decreasing the amount of the boron precursor available to react with the substrate surface to increase the thickness of $B_xAl_{2-x}O_3$. As a result, the rate of growth of $B_xAl_{2-x}O_3$ decreases, allowing for finely tunable precision deposition processes.

Figure 3:
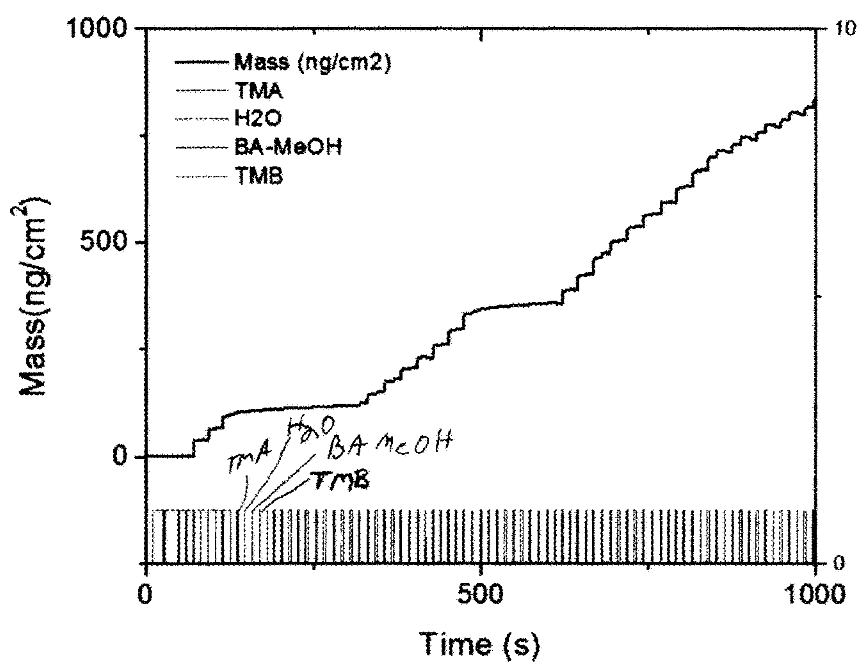
FIG. 3 depicts an amalgamated comparison of the growth profiles of sample nos. 4, 5, and 7 using quartz crystal microbalances. ALD cycles for samples 4, 5, and 7 are shown in Table 1.

FIG. 3 depicts an amalgamated comparison of the growth profiles of sample nos. 4, 5, and 7. Both sample nos. 4 and 7 do not use water precursors in their respective ALD cycles (i.e. sample no. 4: TMA, $N_2$, BA/MeOH, $N_2$ versus sample no. 7: TMA, $N_2$, TMB, $N_2$). FIG. 3 demonstrates the difference in growth to the $B_xAl_{2-x}O_3$ film as a function of boron precursor: essentially no growth is seen when the ALD cycle uses only TMA and TMB (sample no. 7); however, in similar situations where the ALD cycle uses only TMA and boric acid (sample no. 4), a controlled linear growth is observed.

One explanation for the controlled linear growth in sample no. 4 versus almost no growth in sample no. 7 is because the addition of MeOH to BA forms a solution of TMB and $H_2O$. There is a co-dose of $H_2O$ affecting the reaction between TMA and TMB, which results in formation of $B_xAl_{2-x}O_3$. Similar chemistries are observed in formation of $B_xAl_{2-x}O_3$ for sample nos. 2 and 3 (both of which include a flow of BA/MeOH). Thus, the presence of $H_2O$ is a critical factor affecting the growth of $B_xAl_{2-x}O_3$. The amount of boron in $B_xAl_{2-x}O_3$ may be based on the ratio of $H_2O$ and boron-containing precursor in the co-dosed mixture. For systems using BA as the boron precursor, an alcohol is needed to form a solution of TMB and $H_2O$, as explained above. For systems using a TMB boron precursor, $H_2O$ is needed to aide surface reactions to enhance growth of $B_xAl_{2-x}O_3$. As a comparison, when no $H_2O$ is present, essentially no $B_2O_3$ was grown and in fact, for the TMA-BA system of sample no. 1, only pure $Al_2O_3$ was observed. Similarly, in sample no. 7, when only pure TMB is used without any —OH functional group, no film growth was observed. In either the case of sample no. 1 or sample no. 7, there was no growth of $B_xAl_{2-x}O_3$. Water may contribute hydroxide toward the reaction forming $B_xAl_{2-x}O_3$ and as a result, $B_xAl_{2-x}O_3$ grows in controlled manner (i.e. see sample nos. 5 and 6: TMB is very reactive with —OH-rich environments versus —$CH_3$ rich surfaces). When water is added to the ALD cycle, as in sample no. 5, FIG. 3 shows similar, controlled rates of growth increases of the $B_xAl_{2-x}O_3$ film. Thus, when a boric acid precursor is used, controlled, linear growth rates may still be achieved without use of a separate oxygen-containing precursor (i.e. water). This is because the mixture of BA and MeOH spontaneously forms a solution containing TMB and $H_2O$. When a TMB precursor is used, it is advantageous to utilize an oxygen-containing precursor (i.e. water) to achieve controlled, linear growth rates.

FIG. 4 illustrates the increase in mass of the deposited $B_xAl_{2-x}O_3$ film per ALD cycle as a function of dosage times for TMA, water, and TMB precursors. The depicted ALD cycle is for sample no. 5 (see FIG. 2A and Table 1). As the data shows, regardless of precursor time for any of the TMA, water, and TMB precursors (varying from about 0.25 seconds to about 5 seconds), growth of the $B_xAl_{2-x}O_3$ layer increases at a relatively constant rate of approximately 30 $ng/cm^2$ to approximately 35 $ng/cm^2$. This indicates that saturation of the reaction surface as each precursor is introduced into the system chamber (and after purging of the previous precursor) occurs almost immediately and flow rates of the precursors are sufficient to overcome disparities in residence time.

Figure 5:
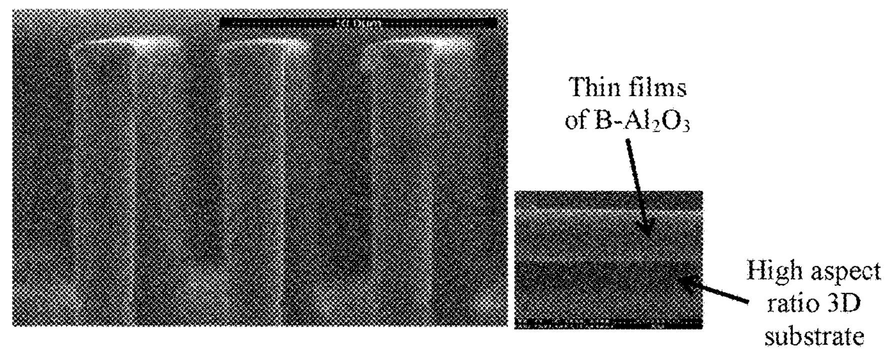
FIG. 5 illustrates a $B_xAl_{2-x}O_3$ film deposited over a high-aspect ratio, 3D substrate.

The ALD processes described herein may be performed on a variety of substrates including semiconductor substrates (i.e. silicon (Si), silicon dioxide ($SiO_2$), aluminum oxide ($Al_2O_3$), sapphire, germanium (Ge), gallium arsenide (GaAs), alloys of silicon and germanium, indium phosphide (InP), etc.), flexible polymer substrates (i.e. polyimides (PI), polyethyleneterephthalates (PET), polyethylenenaphthalates (PEN), polyetheretherketones (PEEK), polyethyleneimines (PEI), polyphenylene sulfides (PPS)), 3D substrates, high-aspect ratio substrates, metal substrates, and devices (i.e. silicon-based photomultipliers (SiPMTs) and micro-channel plate (MCP) detectors). FIG. 5 illustrates the integrity and uniformity of $B_xAl_{2-x}O_3$ films deposited over a high-aspect ratio, 3D substrate trenches.

The present disclosure describes a new method for forming high quality, boron (B) containing $Al_2O_3$ composite layers deposited by atomic layer deposition (ALD) methods. Using the methods described herein, B—$Al_2O_3$ composites may be formed using ALD batch processes that are precisely controlled and economical for large-area deposition of thin and ultrathin B-comprising layers under low temperature environments where the resultant films are (1) free of fluorine (F) contaminants, (2) of uniform thickness and conformal with desire control concentration of boron over large areas and complex 3D structures, (3) tunable for $^{10}B$ or $^{11}B$ isotope containing processes, and (4) stable and robust, with low hydroscopic character (i.e. minimal degradation of $B_xAl_{2-x}O_3$ layers).

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements (i.e. "top," "bottom," "above," "below," "on," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed:

1. A method for forming boron (B) containing $Al_2O_3$ composite layers, comprising:

(a) reacting a substrate surface with an aluminum-containing precursor to form a first monolayer;

(b) purging excess aluminum-containing precursor and reaction by-product;

(c) reacting the first monolayer with a boron-containing precursor to form a boron-containing surface; and (d) purging excess boron-containing precursor and reaction by-product, wherein steps (a) to (d) constitute one cycle, the composite layers being formed after a plurality of cycles, and wherein the resultant composite layers have a chemical formula of $B_xAl_{2-x}O_3$, where x varies in the range of greater than 0 and less than 2.

2. The method of claim 1, wherein step (c) further comprises:

(c3) reacting the boron-containing surface with an oxygen-containing precursor; and (c4) purging excess oxygen-containing precursor and reaction by-product.

3. The method of claim 2, wherein the boron-containing precursor is boric acid ($BH_3O_3$) and the oxygen-containing precursor is water ($H_2O$).

4. The method of claim 1, wherein the boron-containing precursor comprises a boron-containing component and an alcohol compound component.

5. The method of claim 4, wherein the boron-containing component is boric acid ($BH_3O_3$) and the alcohol compound component is a $C_1$-$C_6$ alcohol compound.

6. The method of claim 4, wherein the boron-containing component comprises at least one of boric acid ($BH_3O_3$), trimethyl borate (TMB) ($C_3H_9BO_3$), boron tribromide ($BBr_3$), boron trifluoride ($BF_3$), diboron tetrafluoride ($B_2F_4$), triisopropylborane ($(C_3H_7)_3B$), triethoxyborane ($(C_2H_5O)_3B$), or triisopropoxyborane ($(C_3H_7O)_3B$).

7. The method of claim 4, wherein the alcohol compound component comprises a $C_1$-$C_6$ alcohol compound.

8. The method of claim 4, wherein the boron-containing precursor is enriched with $^{11}B$ or $^{10}B$ isotopic elements.

9. The method of claim 1, wherein the boron-containing precursor is trimethyl borate (TMB) ($C_3H_9BO_3$).

10. The method of claim 1, wherein the boron-containing precursor comprises a boron-containing component and an oxygen-containing component.

11. The method of claim 10, wherein the oxygen-containing component comprises at least one of water ($H_2O$), ozone ($O_3$), hydrogen peroxide ($H_2O_2$), or oxygen ($O_2$).

12. The method of claim 1, wherein the aluminum-containing precursor comprises at least one of trimethylaluminum ($Al(CH_3)_3$) (TMA), triethylaluminum ($(C_2H_5)_3Al$) (TEA), triethyl(tri-sec-butoxy)dialuminum ($(C_2H_5)_3Al_2(OC_4H_9)_3$), aluminum chloride ($AlCl_3$), aluminum isopropoxide ($Al((OCH(CH_3)_2)_3$), dimethylaluminum isopropoxide ($(CH_3)_2AlOCH(CH_3)_2$), tris(2,2,6,6-tetramethyl-3,5-heptanedionato)aluminum ($Al(TMHD)_3$), triisobutylaluminum ($(C_4H_9)_3Al$), aluminum hexafluoroacetylacetonate ($Al(CF_3COCHCOCF_3)_3$), aluminum ethoxide ($Al(OC_2H_5)_3$), aluminum s-butoxide ($Al(OC_4H_9)_3$), or aluminum acetylacetonate ($Al(CH_3COCHCOCH_3)_3$).

13. The method of claim 1, wherein step (c) further comprises:

(c1) reacting the first monolayer with an oxygen-containing precursor to form an oxygen-containing surface; and (c2) purging excess oxygen-containing precursor and reaction by-product.

14. The method of claim 13, wherein step (c) further comprises:

(c3) reacting the oxygen-containing surface with the boron-containing precursor, wherein step (c3) is conducted prior to step (c2).

15. The method of claim 14, wherein the oxygen-containing precursor is water ($H_2O$) and the boron-containing precursor is trimethyl borate (TMB) ($C_3H_9BO_3$).

16. The method of claim 13, wherein step (c) further comprises:

(c3) reacting the oxygen-containing surface with the boron-containing precursor.

17. The method of claim 16, wherein the boron-containing precursor comprises a boron-containing component and an alcohol compound component.

18. The method of claim 17, wherein the boron-containing component is boric acid ($BH_3O_3$) and the alcohol compound component is a $C_1$-$C_6$ alcohol compound.

19. A method for forming boron (B) containing $Al_2O_3$ composite layers, comprising:

(a) reacting a substrate surface with an aluminum-containing precursor to form a first monolayer;

(b) purging excess aluminum-containing precursor and reaction by-product;

(c) reacting the first monolayer with a second precursor, the second precursor comprising a boron-containing component and an alcohol compound component; and (d) purging excess second precursor and reaction by-product, wherein steps (a) to (d) constitute one cycle, the composite layers being formed after a plurality of cycles, and wherein the resultant composite layers have a chemical formula of $B_xAl_{2-x}O_3$, where x varies in the range of greater than 0 and less than 2.

20. A method for forming boron (B) containing $Al_2O_3$ composite layers, comprising:

(a) reacting a substrate surface with an aluminum-containing precursor to form a first monolayer;

(b) purging excess aluminum-containing precursor and reaction by-product;

(c) reacting the first monolayer with a second precursor, the second precursor comprising a boron-containing component and an oxygen-containing component; and (d) purging excess second precursor and reaction by-product, wherein steps (a) to (d) constitute one cycle, the composite layers being formed after a plurality of cycles, and wherein the resultant composite layers have a chemical formula of $B_xAl_{2-x}O_3$, where x varies in the range of greater than 0 and less than 2.

* * * * *